US011189696B2

(12) United States Patent
Wang et al.

(10) Patent No.: US 11,189,696 B2
(45) Date of Patent: Nov. 30, 2021

(54) METHOD FOR PREPARING SELF-ALIGNED SURFACE CHANNEL FIELD EFFECT TRANSISTOR AND POWER DEVICE

(71) Applicant: THE 13TH RESEARCH INSTITUTE OF CHINA ELECTRONICS TECHNOLOGY GROUP CORPORATION, Hebei (CN)

(72) Inventors: Yuangang Wang, Shijiazhuang (CN); Yuanjie Lv, Shijiazhuang (CN); Zhihong Feng, Shijiazhuang (CN); Cui Yu, Shijiazhuang (CN); Chuangjie Zhou, Shijiazhuang (CN); Zezhao He, Shijiazhuang (CN); Xubo Song, Shijiazhuang (CN); Shixiong Liang, Shijiazhuang (CN)

(73) Assignee: THE 13TH RESEARCH INSTITUTE OF CHINA ELECTRONICS, Hebei (CN)

( * ) Notice: Subject to any disclaimer, the term of this patent is extended or adjusted under 35 U.S.C. 154(b) by 0 days.

(21) Appl. No.: 16/964,726

(22) PCT Filed: Mar. 28, 2019

(86) PCT No.: PCT/CN2019/080067
§ 371 (c)(1),
(2) Date: Jul. 24, 2020

(87) PCT Pub. No.: WO2020/147200
PCT Pub. Date: Jul. 23, 2020

(65) Prior Publication Data
US 2020/0373390 A1    Nov. 26, 2020

(30) Foreign Application Priority Data

Jan. 17, 2019  (CN) .................. 201910044987.X

(51) Int. Cl.
*H01L 29/10* (2006.01)
(52) U.S. Cl.
CPC .................. *H01L 29/1033* (2013.01)
(58) Field of Classification Search
CPC . H01L 29/1033; H01L 29/778; H01L 29/401; H01L 29/78681
See application file for complete search history.

(56) References Cited

U.S. PATENT DOCUMENTS

| 7,973,339 B2 | 7/2011 | Kasu |
| 8,221,548 B2 | 7/2012 | Kasu |

(Continued)

FOREIGN PATENT DOCUMENTS

| CN | 1757120 A | 4/2006 |
| CN | 101053075 A | 10/2007 |

(Continued)

OTHER PUBLICATIONS

International Search Report in the international application No. PCT/CN2019/080067, dated Oct. 22, 2019, 2 pgs.

(Continued)

*Primary Examiner* — Changhyun Yi
(74) *Attorney, Agent, or Firm* — Cooper Legal Group, LLC

(57) ABSTRACT

The disclosure provides a method for preparing a self-aligned surface channel field effect transistor, and provides a power device. The method includes the following steps: depositing a first metal mask layer; preparing a first photoresist layer; forming a source area pattern and a drain area pattern; depositing a source metal layer and a drain metal layer on the source area pattern and the drain area pattern; peeling off and removing the first photoresist layer; depositing a second metal mask layer; preparing a second photoresist layer, and forming at least one gate area pattern closer (Continued)

toward the source metal layer by performing exposure and development; removing the first metal mask layer and the second metal mask layer between the source metal layer and the drain metal layer by a wet corrosion; depositing a gate metal layer on the gate area pattern; and peeling off and removing the second photoresist layer.

18 Claims, 1 Drawing Sheet

(56) References Cited

U.S. PATENT DOCUMENTS

| | | |
|---|---|---|
| 8,242,511 B2 | 8/2012 | Kasu |
| 8,328,936 B2 | 12/2012 | Kasu |
| 8,486,816 B2 | 7/2013 | Kasu |
| 8,487,319 B2 | 7/2013 | Kasu |
| 9,711,633 B2 * | 7/2017 | Sheppard ............ H01L 29/0843 |
| 10,170,611 B1 | 1/2019 | Tang et al. |
| 2007/0158683 A1 * | 7/2007 | Sheppard ............ H01L 29/7787 |
| | | 257/183 |
| 2008/0134959 A1 | 6/2008 | Kasu |
| 2008/0134960 A1 | 6/2008 | Kasu |
| 2008/0217626 A1 | 9/2008 | Kasu |
| 2009/0261347 A1 | 10/2009 | Kasu |
| 2010/0289030 A9 | 11/2010 | Kasu |
| 2011/0068352 A1 | 3/2011 | Kasu |
| 2011/0070694 A1 | 3/2011 | Kasu |
| 2012/0034737 A1 | 2/2012 | Kasu |
| 2015/0263116 A1 | 9/2015 | Qiu |
| 2017/0236929 A1 | 8/2017 | Green et al. |

FOREIGN PATENT DOCUMENTS

| | | |
|---|---|---|
| CN | 101359686 A | 2/2009 |
| CN | 103199103 A | 7/2013 |
| CN | 103311276 A | 9/2013 |
| CN | 108695157 A | 10/2018 |

OTHER PUBLICATIONS

"Self-aligned graphene field-effect transistors on SiC (0001) substrates with self-oxidized gate dielectric", Jul. 2014, Li Jia, Yu Chi, Wang Li, Liu Qingbin, He Zezhao, Cai Shujun and Feng Zhihong, Journal of semiconductors vol. 35, No. 7, 5 pgs.

* cited by examiner

METHOD FOR PREPARING SELF-ALIGNED SURFACE CHANNEL FIELD EFFECT TRANSISTOR AND POWER DEVICE

CROSS-REFERENCE TO RELATED APPLICATIONS

The present application is a national stage of International Application No. PCT/CN2019/080067, filed on Mar. 28, 2019, which claims priority to Chinese Patent Application No. 201910044987.X, filed on Jan. 17, 2019. The disclosures of International Application No. PCT/CN2019/080067 and Chinese Patent Application No. 201910044987.X are hereby incorporated by reference in their entireties.

TECHNICAL FIELD

The disclosure belongs to the technical field of microwave power devices, and particularly relates to a method for preparing a self-aligned surface channel field effect transistor, and relates to a power device.

BACKGROUND

Surface channel devices have attracted much attention in the high frequency field due to their advantages in high speed, high limiting performance and the like. At present, materials commonly used for surface channels include hydrogen plasma-treated diamond that is used for forming p-type surface channels, and two-dimensional materials such as graphene, Boron Nitride (BN), black phosphorus and GaN. Characteristics of the surface channel devices are greatly affected by surface states, so that a self-aligned process has been developed in recent years to effectively solve the above problems. However, the self-aligned process may only obtain a device in which gate-source spacing is equal to gate-drain spacing, but it is difficult to balance breakdown voltage and saturation current.

SUMMARY

Technical Problem

An objective of the disclosure is to provide a method for preparing a self-aligned surface channel field effect transistor to solve the technical problem in the conventional art that the gate is in the middle of the source and the drain, while the breakdown voltage is generally low.

Technical Solution

In order to realize the above objective, the disclosure provides a method for preparing a self-aligned surface channel field effect transistor.

The method includes the following steps:

a first metal mask layer is deposited on a surface channel epitaxial layer;

a first photoresist layer is prepared on the first metal mask layer;

a source area pattern and a drain area pattern are formed by performing exposure and development;

the first metal mask layer on the source area pattern and the drain area pattern is removed by performing a wet corrosion;

a source metal layer and a drain metal layer are deposited on the source area pattern and the drain area pattern;

the first photoresist is peeled off and removed;

a second metal mask layer is deposited on the source metal layer, the drain metal layer and the first metal mask layer;

a second photoresist layer is prepared, and at least one gate area pattern is formed by performing exposure and development; the gate area pattern is closer toward the source metal layer;

the first metal mask layer and the second metal mask layer between the source metal layer and the drain metal layer are removed by a wet corrosion, and the source metal layer and the drain metal layer are corrosion stopping layers;

a gate metal layer is deposited on the gate area pattern; and the second photoresist layer is peeled off and removed.

Further, before depositing the gate metal layer on the gate area pattern, a gate lower dielectric layer is deposited on the surface channel epitaxial layer, and the gate metal layer is deposited on the gate lower dielectric layer.

Further, the gate lower dielectric layer is a single-layer dielectric.

Alternatively, the gate lower dielectric layer is a multi-layer dielectric.

Further, two second photoresist layers are prepared, and the at least one gate area pattern formed by exposure and development is closer toward the source metal layer.

Further, when there are two or more gate area patterns, the gate area patterns have the same structure.

Alternatively, at least one of the gate area patterns has different structure from structures of other gate area patterns.

Alternatively, the gate area patterns have structures that are different from each other.

Further, the gate metal layer has a structure selected from a straight gate, a T-shaped gate, a TT-shaped gate, a TTT-shaped gate, a U-shaped gate, a Y-shaped gate and a combination thereof.

Further, metal types of the first metal mask layer and the second metal mask layer are identical, but are different from metal types of the source metal layer and the drain metal layer.

Alternatively, the first metal mask layer and the second metal mask layer have different metal types, and are different from the metal types of the source metal layer and the drain metal layer.

Further, each of the first metal mask layer, the second metal mask layer, the source metal layer, the drain metal layer and the gate metal layer is a single-layer metal or a multi-layer metal. Alternatively, the first metal mask layer, the second metal mask layer, the source metal layer, the drain metal layer and the gate metal layer at least include one single-layer metal and one multi-layer metal.

Further, after preparing the gate metal layer, a passivation layer is prepared.

The disclosure further provides a power device prepared by the method mentioned above.

Beneficial Effect

According to the method for preparing the self-aligned surface channel field effect transistor of the disclosure, it is obtained a gate-close-to-source or gate-close-to-drain structure, i.e., the gate is not located in the middle of the source and the drain. The gate-close-to-source device obtained can increase the breakdown voltage and achieve a high power density, while balancing the saturation current.

BRIEF DESCRIPTION OF THE DRAWINGS

In order to more clearly illustrate the technical solutions in the embodiments of the disclosure, the disclosure will be

LIST OF REFERENCE NUMERALS

1—surface channel epitaxial layer; 2—source metal layer; 3—second metal mask layer; 4—second photoresist layer; 5—gate metal layer; 6—gate area pattern; 7—drain metal layer; 8—first metal mask layer; 9—first photoresist layer; 10—gate lower dielectric layer.

DETAILED DESCRIPTION

In order to make the technical problems, technical solutions and beneficial effects of the disclosure clearer, the disclosure will be further described in detail below with reference to the drawings and embodiments. It should be understood that the specific embodiments described herein are merely used to illustrate the disclosure, but are not intended to limit the disclosure.

Figure 1:
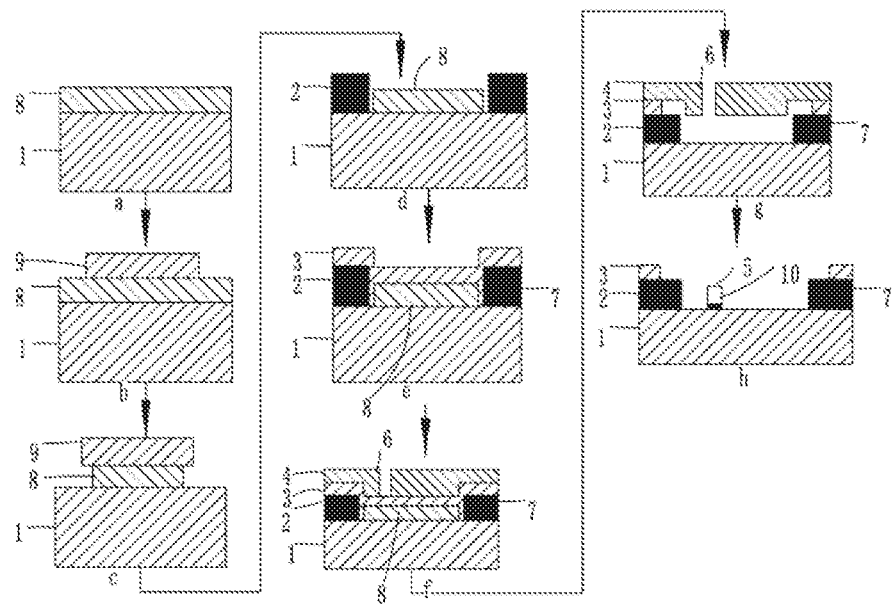
FIG. 1 is a schematic structural diagram I of a method for preparing a self-aligned surface channel field effect transistor provided by an embodiment of the disclosure.
Figure 2:
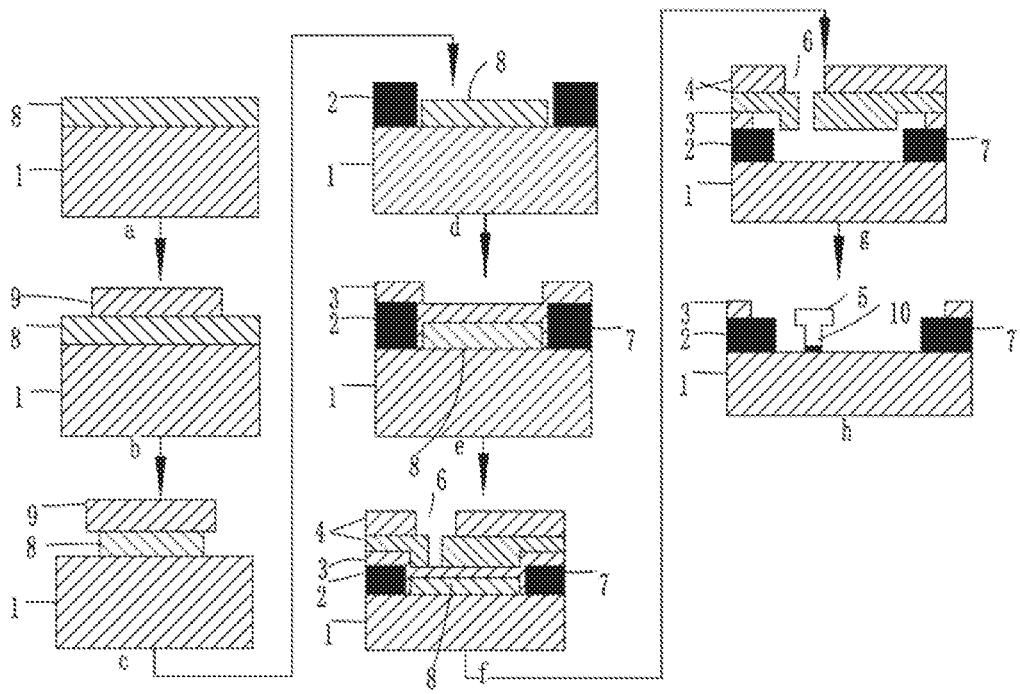
FIG. 2 is a schematic structural diagram II of a method for preparing a self-aligned surface channel field effect transistor provided by an embodiment of the disclosure.

Referring to FIG. 1 and FIG. 2 together, the method for preparing the self-aligned surface channel field effect transistor provided by the present application will be described. The method for preparing the self-aligned surface channel field effect transistor includes the following steps.

A first metal mask layer 8 is deposited on a surface channel epitaxial layer 1, referring to a shown in FIG. 1 and FIG. 2.

A first photoresist layer 9 is prepared on the first metal mask layer 8, referring to b shown in FIG. 1 and FIG. 2.

A source area pattern and a drain area pattern are formed by performing exposure and development, referring to c shown in FIG. 1 and FIG. 2.

The first metal mask layer 8 on the source area pattern and the drain area pattern is removed by performing a wet corrosion.

A source metal layer 2 and a drain metal layer 7 are deposited on the source area pattern and the drain area pattern, referring to d shown in FIG. 1 and FIG. 2.

The first photoresist layer is peeled off and removed.

A second metal mask layer 3 is deposited on the source metal layer 2, the drain metal layer 7 and the first metal mask layer 8, referring to e shown in FIG. 1 and FIG. 2.

Referring to f shown in FIG. 1 and FIG. 2, a second photoresist layer 4 is prepared, and at least one gate area pattern 6 is formed by performing exposure and development. In addition, the gate area pattern is closer toward the source metal layer 2.

The first metal mask layer 8 and the second metal mask layer 3 between the source metal layer 2 and the drain metal layer 7 are removed by performing a wet corrosion, referring to g shown in FIG. 1 and FIG. 2. In addition, the source metal layer 2 and the drain metal layer 7 are corrosion stopping layers.

A gate metal layer 5 is deposited on the gate area pattern 6, referring to h shown in FIG. 1 and FIG. 2.

The second photoresist layer 4 is peeled off and removed.

Compared with the prior art, according to the method for preparing the self-aligned surface channel field effect transistor of the disclosure, the gate metal layer 5 is closer toward the source metal layer 2 or the drain metal layer 7 instead of being located in the middle of the source metal layer 2 and the drain metal layer 7. That is, the source metal layer 2 and the drain metal layer 7 are asymmetrically distributed relative to the gate metal layer 5. The gate-close-to-source device can effectively increase the breakdown voltage and working voltage as well as a power density, while balancing the saturation current. Furthermore, the T-shaped gate is favorable for balancing gate parasitic capacitance and gate resistance characteristics, thereby improving device frequency characteristics.

A mesa isolation process may be performed after any one of the above steps and aims to isolate the device prepared by the disclosure from other parts.

Each of photoresist layers may be subjected to one exposure and one development, or may be subjected to multiple exposures and one development, or may be subjected to multiple exposures and multiple developments, so as to form a corresponding area pattern. In addition, each of photoresist layers has an integer layer greater than or equal to 1.

In the present embodiment, when the gate is closes toward the source, i.e., an effective gate-source spacing is less than an effective gate-drain spacing, the field effect transistor can supply the breakdown voltage and the working voltage with balancing the saturation current. Of course, the effective gate-source spacing may also be greater than the effective gate-drain spacing.

Referring to FIG. 1 to FIG. 2 together, it is shown a specific embodiment of the method for preparing the self-aligned surface channel field effect transistor of the disclosure. Before depositing the gate metal layer 5 on the gate area pattern 6, a gate lower dielectric layer 10 is deposited on the surface channel epitaxial layer 1, and the gate metal layer 5 is deposited on the gate lower dielectric layer 10.

Referring to FIG. 1 to FIG. 2, as a specific embodiment of the method for preparing the self-aligned surface channel field effect transistor of the disclosure, the gate lower dielectric layer 10 is a single-layer dielectric; or the gate lower dielectric layer 10 is a multi-layer dielectric.

Referring to FIG. 2, as a specific embodiment of the method for preparing the self-aligned surface channel field effect transistor of the disclosure, two second photoresist layers 4 are prepared. In addition, at least one gate area pattern 6 is formed after exposure and development, while the gate area pattern 6 is closer toward the source metal layer 2.

As a specific embodiment of the method for preparing the self-aligned surface channel field effect transistor of the disclosure, when there are two or more gate area patterns 6, the gate area patterns 6 may have the same structure; or, at least one of the gate area patterns 6 has a structure different from those of other gate area patterns 6; or, the gate area patterns 6 have structures that are different from each other. Depending on actual requirements, the patterns may or may not be exactly the same at structure or size.

Referring to FIG. 1 and FIG. 2, as a specific embodiment of the method for preparing the self-aligned surface channel field effect transistor of the disclosure, the gate metal layer 5 may have the structure selected from a straight gate, a T-shaped gate, a TT-shaped gate, a TTT-shaped gate, a U-shaped gate, a Y-shaped gate and a combination thereof. In the embodiment, the gate metal layer 5 shown in FIG. 1 is a straight gate. The gate metal layer 5 shown in FIG. 2 is a T-shaped gate. In order to prepare a T-shaped gate, the second photoresist layer needs to be two layers, and the structure and number of the gate metal layer 5 are determined according to the structure and number of gate corrosion window patterns in the photolithography.

As a specific embodiment of the method for preparing the self-aligned surface channel field effect transistor of the disclosure, the metal types of the first metal mask layer 8 and the second metal mask layer 3 are identical but are different from metal types of the source metal layer 2 and the drain metal layer 7. Alternatively, the metal types of the first metal mask layer 8 and the second metal mask layer 3 are different and are still different from the metal types of the source metal layer 2 and the drain metal layer 7.

As a specific embodiment of the method for preparing the self-aligned surface channel field effect transistor of the disclosure, each of the first metal mask layer 8, the second metal mask layer 3, the source metal layer 2, the drain metal layer 7 and the gate metal layer 5 is a single-layer metal or multi-layer metal, or at least include one single-layer metal and one multi-layer metal. The metals are conventionally used metals for preparing semiconductor devices in the art.

As a specific embodiment of the method for preparing the self-aligned surface channel field effect transistor of the disclosure, after preparing the gate metal layer 5, a passivation layer is prepared to protect the device. The passivation layer is a single-layer dielectric or a multi-layer dielectric.

As a specific embodiment of the method for preparing the self-aligned surface channel field effect transistor of the disclosure, the surface channel epitaxial layer 11 is a diamond p-type surface channel or is formed by two-dimensional materials such as graphene, BN, black phosphorus and GaN. The substrate used is made of diamond, SiC, GaN, sapphire, Si, Au, quartz, SiO2, SiN, copper or other materials, or is a composite substrate made of various materials.

The disclosure further provides a power device prepared by the method mentioned above. Regarding the power device prepared by the disclosure, the gate metal layer 5 is closer toward the source metal layer 2 instead of being located at the middle of the source metal layer 2 and the drain metal layer 7. That is, the source metal layer 2 and the drain metal layer 7 are asymmetrically distributed relative to the gate metal layer 5. The gate-close-to-source device can effectively increase breakdown voltage and working voltage as well as the power density of the device, while balancing the saturation current.

The above description is merely used to illustrate the preferred embodiments of the disclosure and is not intended to limit the disclosure. Any modification, equivalent replacements, improvements and the like made within the spirit and principle of the disclosure should fall within the protection scope of the disclosure.

The invention claimed is:

1. A method for preparing a self-aligned surface channel field effect transistor, comprising following steps:
   depositing a first metal mask layer on a surface channel epitaxial layer;
   preparing a first photoresist layer on the first metal mask layer;
   forming a source area pattern and a drain area pattern by performing exposure and development;
   removing the first metal mask layer from the source area pattern and the drain area pattern by a wet corrosion;
   depositing a source metal layer and a drain metal layer on the source area pattern and the drain area pattern;
   peeling off and removing the first photoresist layer;
   depositing a second metal mask layer on the source metal layer, the drain metal layer and the first metal mask layer;
   preparing a second photoresist layer, and forming at least one gate area pattern by performing exposure and development, and wherein the gate area pattern being closer toward the source metal layer;
   removing the first metal mask layer and the second metal mask layer between the source metal layer and the drain metal layer by a wet corrosion, wherein the source metal layer and the drain metal layer being corrosion stopping layers;
   depositing a gate metal layer on the gate area pattern; and
   peeling off and removing the second photoresist layer.

2. The method for preparing the self-aligned surface channel field effect transistor of claim 1, wherein before depositing the gate metal layer on the gate area pattern, depositing a gate lower dielectric layer on the surface channel epitaxial layer; and wherein the gate metal layer being deposited on the gate lower dielectric layer.

3. The method for preparing the self-aligned surface channel field effect transistor of claim 2, wherein the gate lower dielectric layer is a single-layer dielectric; or the gate lower dielectric layer is a multi-layer dielectric.

4. The method for preparing the self-aligned surface channel field effect transistor of claim 1, wherein two second photoresist layers are prepared, and the at least one gate area pattern formed by exposure and development is closer toward the source metal layer or the drain metal layer.

5. The method for preparing the self-aligned surface channel field effect transistor of claim 1, wherein when there are two or more the gate area patterns, the gate area patterns have same structure; or at least one of the gate area patterns has different structure from structures of other gate area patterns; or the gate area patterns have structures that are different from each other.

6. The method for preparing the self-aligned surface channel field effect transistor of claim 1, wherein the gate metal layer has a structure selected from a straight gate, a T-shaped gate, a TT-shaped gate, a TTT-shaped gate, a U-shaped gate, a Y-shaped gate and a combination thereof.

7. The method for preparing the self-aligned surface channel field effect transistor of claim 1, wherein metal types of the first metal mask layer and the second metal mask layer are identical, but are different from metal types of the source metal layer and the drain metal layer; or
   the metal types of the first metal mask layer and the second metal mask layer are different, and are still different from the metal types of the source metal layer and the drain metal layer.

8. The method for preparing the self-aligned surface channel field effect transistor of claim 1, wherein each of the first metal mask layer, the second metal mask layer, the source metal layer, the drain metal layer and the gate metal layer is a single-layer metal; or
   each of the first metal mask layer, the second metal mask layer, the source metal layer, the drain metal layer and the gate metal layer is a multi-layer metal; or
   the first metal mask layer, the second metal mask layer, the source metal layer, the drain metal layer and the gate metal layer at least comprise one single-layer metal and one multi-layer metal.

9. The method for preparing the self-aligned surface channel field effect transistor of claim 1, wherein after preparing the gate metal layer, preparing a passivation layer.

10. A power device, prepared by a method comprising following steps:
- depositing a first metal mask layer on a surface channel epitaxial layer;
- preparing a first photoresist layer on the first metal mask layer;
- forming a source area pattern and a drain area pattern by performing exposure and development;
- removing the first metal mask layer from the source area pattern and the drain area pattern by a wet corrosion;
- depositing a source metal layer and a drain metal layer on the source area pattern and the drain area pattern;
- peeling off and removing the first photoresist layer;
- depositing a second metal mask layer on the source metal layer, the drain metal layer and the first metal mask layer;
- preparing a second photoresist layer, and forming at least one gate area pattern by performing exposure and development, and wherein the gate area pattern being closer toward the source metal layer;
- removing the first metal mask layer and the second metal mask layer between the source metal layer and the drain metal layer by a wet corrosion, wherein the source metal layer and the drain metal layer being corrosion stopping layers;
- depositing a gate metal layer on the gate area pattern; and
- peeling off and removing the second photoresist layer.

11. The power device of claim 10, wherein before depositing the gate metal layer on the gate area pattern, depositing a gate lower dielectric layer on the surface channel epitaxial layer; and wherein the gate metal layer being deposited on the gate lower dielectric layer.

12. The power device of claim 11, wherein the gate lower dielectric layer is a single-layer dielectric; or the gate lower dielectric layer is a multi-layer dielectric.

13. The power device of claim 10, wherein two second photoresist layers are prepared, and the at least one gate area pattern formed by exposure and development is closer toward the source metal layer or the drain metal layer.

14. The power device of claim 10, wherein when there are two or more the gate area patterns, the gate area patterns have same structure; or at least one of the gate area patterns has different structure from structures of other gate area patterns; or the gate area patterns have structures that are different from each other.

15. The power device of claim 10, wherein the gate metal layer has a structure selected from a straight gate, a T-shaped gate, a TT-shaped gate, a TTT-shaped gate, a U-shaped gate, a Y-shaped gate and a combination thereof.

16. The power device of claim 10, wherein metal types of the first metal mask layer and the second metal mask layer are identical, but are different from metal types of the source metal layer and the drain metal layer; or
- the metal types of the first metal mask layer and the second metal mask layer are different, and are still different from the metal types of the source metal layer and the drain metal layer.

17. The power device of claim 10, wherein each of the first metal mask layer, the second metal mask layer, the source metal layer, the drain metal layer and the gate metal layer is a single-layer metal; or
- each of the first metal mask layer, the second metal mask layer, the source metal layer, the drain metal layer and the gate metal layer is a multi-layer metal; or
- the first metal mask layer, the second metal mask layer, the source metal layer, the drain metal layer and the gate metal layer at least comprise one single-layer metal and one multi-layer metal.

18. The power device of claim 10, wherein after preparing the gate metal layer, preparing a passivation layer.

* * * * *